United States Patent [19]

Iijima et al.

[11] Patent Number: 4,624,867
[45] Date of Patent: Nov. 25, 1986

[54] PROCESS FOR FORMING A SYNTHETIC RESIN FILM ON A SUBSTRATE AND APPARATUS THEREFOR

[75] Inventors: Masayuki Iijima, Yatabemachi; Yoshikazu Takahashi, Ohhomachi, both of Japan

[73] Assignee: Nihon Shinku Gijutsu Kabushiki Kaisha, Kanagawa, Japan

[21] Appl. No.: 714,291

[22] Filed: Mar. 21, 1985

[30] Foreign Application Priority Data

| Mar. 21, 1984 [JP] | Japan | 59-52344 |
| Aug. 30, 1984 [JP] | Japan | 59-179293 |
| Sep. 25, 1984 [JP] | Japan | 59-200257 |

[51] Int. Cl.$^4$ .................................... C23C 16/00
[52] U.S. Cl. ................................. 427/255.6; 427/44; 427/54.1; 427/255.1; 427/255.2
[58] Field of Search ............. 427/54.1, 44, 255.1, 427/255.6, 255.2; 204/159.19, 159.11

[56] References Cited

U.S. PATENT DOCUMENTS

| 3,119,707 | 1/1964 | Christy | 427/44 |
| 3,271,180 | 9/1966 | White | 430/319 |
| 3,374,111 | 3/1968 | Brennemann | 427/44 |
| 3,406,040 | 10/1968 | Da Silva et al. | 427/44 |
| 3,578,425 | 5/1971 | Wright et al. | 427/44 |
| 3,607,365 | 9/1971 | Lindlof | 427/255.1 |
| 3,619,259 | 11/1971 | Wright et al. | 427/54.1 |
| 3,665,269 | 5/1972 | Wright et al. | 427/54.1 |
| 3,686,022 | 8/1972 | White et al. | 427/54.1 |
| 3,829,324 | 8/1974 | Blais et al. | 427/44 |
| 4,009,153 | 2/1977 | Shin | 260/78 |
| 4,048,349 | 9/1977 | White et al. | 427/255.1 |
| 4,104,438 | 8/1978 | Angelo et al. | 428/332 |
| 4,107,349 | 8/1978 | Vig | 427/44 |
| 4,260,466 | 4/1981 | Shirahata et al. | 427/54.1 |
| 4,331,705 | 5/1982 | Samudrala | 427/54.1 |
| 4,331,722 | 5/1982 | Packo et al. | 427/255.1 |
| 4,357,364 | 11/1982 | Jones | 427/44 |

OTHER PUBLICATIONS

"Polymerization from the Vapor Phase. I. Poly (p—phenyleneterephthalamide) Gas Barrier Coatings", Ikeda et al, J. Applied Polymer Science, vol. 25: 1391-1405 (1980).

*Primary Examiner*—John H. Newsome
*Attorney, Agent, or Firm*—Armstrong, Nikaido, Marmelstein & Kubovcik

[57] ABSTRACT

A process for forming a covering film of a synthetic resin on a substrate comprising, under vacuum conditions, evaporating at least two monomers to cause vapors of said at least two monomers to adhere to the substrate, and polymerizing said at least two monomers on said substrate.

An apparatus for carrying out the process includes a vacuum chamber and provided therein, means for holding and evaporating at least two raw material monomers for the synthetic resin, means for holding and heating the substrate and a shutter for separating the means for holding the monomers and the means for holding the substrate. The means for holding and heating the monomers can be provided outside the vacuum chamber and a window can be provided in a wall of the chamber to allow the substrate to be irradiated from a light source located outside the chamber.

18 Claims, 3 Drawing Figures

4,624,867

PROCESS FOR FORMING A SYNTHETIC RESIN FILM ON A SUBSTRATE AND APPARATUS THEREFOR

BACKGROUND OF THE INVENTION

This invention relates to a process for forming various types of synthetic resin covering films such as insulation films of a semi-conductor element, a passivation film thereof, a soft error preventing film thereof, a liquid crystal orientation film of a liquid crystal display element, a separation film for a liquid or gas, a photo resist film or the like, and to an apparatus for carrying out the foregoing process.

DESCRIPTION OF THE PRIOR ART

As a process for forming a synthetic resin covering film for various substrates, a wet-type process is known wherein a raw material monomer for a synthetic resin is dissolved and polymerized in a solvent and is applied to a substrate. A polymer vapor deposition type process is also known wherein a synthetic resin polymer itself is vaporized and vapors thereof are deposited on a substrate. Additionally, a plasma polymerization type process is known in which a raw material monomer for a synthetic resin is brought into a plasma condition and is polymerized on a substrate placed in the plasma atmosphere.

The foregoing three conventional processes, however, are inconvenient for the reasons described below. Namely, in the wet process it is very difficult to obtain an extremely thin film, and adhesion of the synthetic resin covering film to the substrate is not sufficient. Additionally, impurities are liable to be mixed in the film because the process involves steps for addition of the solvent, removal thereof, recovery of the solvent, and the like.

In the polymer vapor deposition process the degree of polymerization of the film may be insufficient because decomposition and depolymerization frequently occur. The plasma polymerization process is inconvenient because control design of the molecular structure of the synthetic resin is difficult. The reason for this is that the raw material monomer itself decomposes and, in addition, the resultant synthetic resin is limited to a comparatively rigid one because bridge structures, i.e., crosslinks, are inevitably contained thereon.

It is an object of the present invention, therefore, to provide a process for forming a synthetic resin covering film that is free from the foregoing inconveniences.

It is also an object of the present invention to provide a process that will provide a synthetic resin covering film for a substrate that is high in purity, has good adhesion to the substrate and that possesses good electrical insulating properties, good chemical resistance and good heat resisting properties.

It is a further object of the present invention to provide an apparatus that provides a synthetic resin covering film for substrates that avoids the disadvantages of the prior known processes.

SUMMARY OF THE INVENTION

According to the present invention these and other objects are accomplished by a process wherein one or more monomers which, when polymerized, will form a synthetic resin and a substrate are provided in a vacuum atmosphere, the monomer or monomers are evaporated and adhere to the substrate and are then polymerized on the substrate.

According to the present invention there is also provided an apparatus for forming a synthetic resin covering film which includes a treatment chamber connected to a vacuum evacuation system and provided with one or more evaporation containers for at least one synthetic resin raw material monomer and a substrate holder, the evaporation container or containers and substrate holder being disposed so as to face one another. A heater is provided behind the substrate holder and a heater is provided around the evaporation container or containers and a shutter is disposed in the treatment chamber to separate and isolate the evaporation container or containers and the substrate holder.

In another embodiment at least one evaporation container extends to the exterior of the treatment chamber and the portion of the container extending to the exterior of the chamber is provided with a heater for evaporating the raw material monomer.

In a further embodiment of the invention a light source for irradiating the substrate with light rays through a light transmission window of the treatment chamber is provided.

DESCRIPTION OF PREFERRED EMBODIMENTS

In the process of the invention the evaporation of the raw material monomer or monomers is carried out under a vacuum so that the evaporated monomer or monomers can be prevented from impinging on one another or on the walls of the treatment chamber as much as possible. Consequently, monomer vapors adhere directly to the substrate to be polymerized thereon. The pressure of the vacuum is usually set to be about $1 \times 10^{-2}$ to $1 \times 10^{-6}$ Torr.

The raw material monomers are not limited with respect to kind or number and it is possible to design the molecular structure, i.e., polymer backbone, of the synthetic resin by properly selecting the kind and number of monomers according to the desired synthetic resin covering film to be formed. Any of various polymerization mechanisms such as addition polymerization, condensation polymerization and others can be used.

If heating of the raw material monomer is necessary for causing polymerization thereof, the raw material monomer can be deposited on a substrate which has been previously heated to a predetermined temperature or the substrate can be heated after depositing the raw material monomer on the substrate at room temperature.

A second feature of this invention is an apparatus for easily carrying out the process for forming the foregoing synthetic resin covering film especially by means of heat polymerization. The apparatus is characterized as including a substrate holder and an evaporation container for a raw material monomer disposed so as to face one another in a treatment chamber connected to a vacuum evacuation system. A heater is provided behind the substrate holder, and a heater is provided around the evaporation container. Additionally, a shutter is interposed between the substrate holder and the evaporation container.

A third feature of this invention is an apparatus for carrying out a process for forming the foregoing synthetic resin covering film especially by means of photopolymerization. This apparatus is characterized as comprising a substrate holder and an evaporation container for a raw material monomer disposed so as to face one another in a treatment chamber connected to a vacuum evacuation system. A heater is provided around the evaporation container, and a light source for irradiating the rays of light thereof on a substrate located on the substrate holder through a light transmission window of the treatment chamber is provided outside the treatment chamber. A shutter is interposed between the substrate holder and the evaporation container.

Examples of this invention will now be explained with reference to the accompanying drawings.

Figure 1:
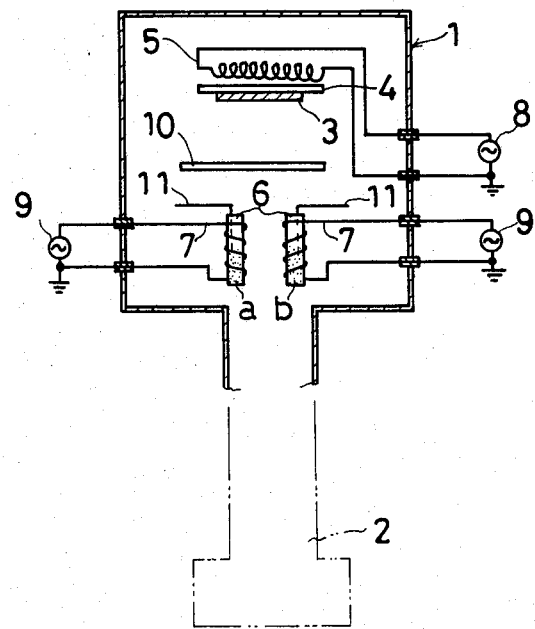
FIG. 1 is a sectional view of one embodiment of the apparatus of the present invention for carrying out the process of the invention.

FIG. 1 shows one embodiment of an apparatus for carrying out the process of this invention, wherein numeral 1 denotes a treatment chamber. The treatment chamber 1 is connected to a vacuum evacuation system 2 such as an exterior vacuum pump or the like, and a substrate 3, for example, a 10 cm × 10 cm square, on a surface of which a film of synthetic resin is to be formed is held by a substrate holder 4 provided in the treatment chamber 1 so as to be directed downwardly. The substrate 3 is arranged to be heated to a predetermined temperature by a heater 5 provided behind a back surface of the substrate holder 4. In addition, tubular evaporation containers 6, 6 which are typically made of glass for holding and evaporating two kinds of raw material monomers a, b for making a synthetic resin are provided at a lower portion of the interior of the treatment chamber 1 so as to be directed towards the substrate 3, and each of these evaporation containers 6, 6 is arranged to be heated to a predetermined temperature by a heater coiled around the same. More than two evaporation containers and more than one substrate holder can, of course, be provided.

In FIG. 1, numeral 8 denotes an electric power source for the heater 5, numeral 9 denotes an electric power source for the heater 7, and numeral 10 denotes a shutter interposed between and separating the substrate 3 and the evaporation containers 6, 6. The shutter can be opened and closed as desired. The distance between the evaporation container 6 and the substrate 3 was about 30 cm. The apparatus of the invention, however, is not limited to this distance and appropriate separation distances can be readily determined by those skilled in the art.

Numeral 11 denotes a thermocouple inserted in each of the raw material monomers a, b for monitoring the temperature thereof so that the temperature can be measured by a temperature control means (not shown) provided on the exterior of the treatment chamber.

Forming of a polyimide covering film and of a polyamide covering film by condensation polymerization by using the foregoing apparatus is described in the following Embodiment Example 1 and Embodiment Example 2, respectively.

EMBODIMENT EXAMPLE 1

A raw material monomer a comprising pyromellitic acid dianhydride and a raw material monomer b comprising 4,4'-diaminodiphenylether were charged to respective evaporation containers 6, 6, and the pressure of the atmospheric gas in the treatment chamber 1 was adjusted to $1 \times 10^{-5}$ Torr through the vacuum evacuation system 2 while the shutter 10 was closed.

Thereafter, while the temperature of each respective monomer was being measured by means of the thermocouples 11, 11 inserted in the respective evaporation containers 6, 6, the pyromellitic acid dianhydride was heated to $175° \pm 2°$ C., and the 4,4'-diaminodiphenylether was heated to $170° \pm 2°$ C., by the respective heaters 7, 7.

Next, after the raw material monomers a, b were brought to the predetermined temperatures at which they begin to evaporate, the shutter 10 was opened, and vapors of the raw material monomers a, b were thereby deposited on the substrate 3 to a predetermined thickness at a deposition rate of 150 Å/min. Thereafter, the shutter 10 was closed, and the substrate 3 was heated to 250° C. by the heater 5 and was maintained at this temperature for 40–60 minutes to bring about the polycondensation reaction of the monomers on the substrate 3 and form the polyimide covering film on the substrate 3.

The raw material monomers a, b were evaporated at a mol ratio of 1:1, in terms of stoichiometry, by adjusting the vapor pressures thereof.

The resultant polyimide covering film had a thickness of 1000 Å and was fine in structure, high in purity, and had good adhesion to the substrate. Additionally, the film was as good as that formed by a convention wet type process with respect to properties such as electrical insulating, chemical resistance and heat resistance.

Further, as the raw material monomer a, there can also be used other aromatic acid dianhydrides including 1,4,5,8-naphthalene tetracarboxylic dianhydride; 1,2,4,5-benzene tetracarboxylic dianhydride; 3,3',4,4'-benzophenone tetracarboxylic dianhydride, and the like. As the raw material monomer b, there can also be used other aromatic diamines such as m-diaminobenzene, p-diaminobenzene, 4,4'-diaminodiphenylmethane, and the like.

EMBODIMENT EXAMPLE 2

A raw material monomer a comprising terephthalic acid dichloride and a raw material monomer b comprising 4,4'-diaminodiphenylether were charged to respective evaporation containers 6, 6 and the overall pressure of the atmospheric gas in the treatment chamber 1 was adjusted to $1 \times 10^{-5}$ Torr through the vacuum evacuation system 2 with the shutter 10 closed. Thereafter, in essentially the same manner as in Example 1, the terephthalic acid dichloride was heated to $64° \pm 2°$ C. and the 4,4'-diaminodiphenylether was heated to $165° \pm 2°$ C. by the respective heaters 7, 7. In this case, the pressure in the treatment chamber 1 was adjusted to $5 \times 10^{-3}$ Torr by the vapor pressure of the terephthalic acid dichloride so that the respective raw material monomers a, b were evaporated in a mol ratio of 1:1.

Thereafter, the shutter 10 was opened, and vapors of the raw material monomers a, b were deposited on the substrate 3 at a deposition rate of 60 Å/min. The polymerization reaction was carried out at room temperature, and the shutter was closed when the film reached a predetermined thickness.

The polymerization reaction on the substrate 3 is believed to occur as described below. Firstly, vapors of the 4,4'-diaminodiphenylether adhere to the substrate 3. Vapors of the terephthalic acid dichloride evaporated simultaneously are then brought into contact with the 4,4'-diaminodiphenylether and are polymerized on the substrate 3. Thereafter, the two kinds of vapors are continuously deposited on the substrate one after another and are continuously polymerized.

The resultant polyamide covering film having a thickness of 1000 Å also had a fine structure, was high in purity, and had good adhesion to the substrate. Also, the covering film had properties equivalent to a covering film formed by a conventional wet type process with respect to properties such as electrical insulating properties, chemical resistance and heat resistance.

Furthermore, as the raw material monomer a for preparing a polyamide film, other aromatic acid dichlorides such as isophthalic acid dichloride, etc. can be used and as the raw material monomer b for preparing the polyamide film, any other specific kind of aromatic diamine such as that used, for instance, in Example 1, can also be used.

Next, the preparation of a polyurea covering film and of a polyurethane covering film by addition polymerization are described in the following Embodiment Example 3 and Embodiment Example 4.

EMBODIMENT EXAMPLE 3

A raw material monomer a comprising 4,4'-diphenylmethane diisocyanate and a raw material monomer b comprising 4,4'-diaminodiphenylether were charged to the respective evaporation containers 6, 6 and the whole pressure of the atmospheric gas in the treatment chamber 1 was adjusted to $1 \times 10^{-5}$ Torr with the shutter 10 closed. Thereafter, the 4,4'-diphenylmethane diisocyanate and 4,4'-diaminodiphenylether were heated, by the heaters 7, 7, to 82°±2° C. and 140°±2° C., respectively. The shutter 10 was then opened, to allow the monomers a, b to be deposited on the substrate 3 at a deposition rate of 60 Å/min. The polymerization reaction thereof proceeded at room temperature to form a polyurea covering film of a predetermined thickness. During this operation, the raw material monomers a, b were evaporated in a mol ratio of 1:1, in terms of stoichiometry, by adjusting the vapor pressure thereof.

The resultant polyurea covering film of 1000 Å in thickness had a fine, uniform structure and thickness and was high in purity and adhered well to the substrate. The film was better with respect to its heat resisting property than a film formed by the conventional process.

Other diisocyanates such as toluene-2,4-diisocyanate and the like can also be used as the raw material monomer a for preparing a polyurea covering film and as the raw material monomer b for preparing such films, there can also be used other aromatic diamines, such as that used, for example, in Example 1.

It should be noted that although the polymerization reaction was carried out at room temperature in Examples 2 and 3, the degree of polymerization of the covering film to be produced can be adjusted by heating the substrate 3 to a predetermined temperature by using the heater 5.

EMBODIMENT EXAMPLE 4

A raw material monomer a comprising 4,4'-diphenylmethane diisocyanate and a raw material monomer b comprising p-hydroquinone were charged to the evaporation containers 6, 6 and the overall pressure of the atmospheric gas in the treatment chamber 1 was set to $1 \times 10^{-5}$ Torr through the vacuum evacuation system 2.

Thereafter, with the shutter 10 closed, the 4,4'-diphenylmethane diisocyanate and the p-hydroquinone were heated by heaters 7,7 to 82°±2° C. and 120°±2° C., respectively, in essentially the same manner as in the foregoing examples. The shutter 10 was then opened while maintaining the pressure at $1 \times 10^{-5}$ Torr. The raw material monomers a, b were deposited on the substrate 3 at a deposition rate of 600 Å/min., while the substrate 3 was being heated to 150° C., whereby the monomers polymerized on the substrate 3 to form a polyurethane covering film.

The polyurethane covering film thus produced in this example had a thickness of 1000 Å and was also excellent in structural properties, high in purity, and had good adhesion to the substrate. The film was nearly equal in heat resisting property to films formed by the convention process.

The raw material monomer a used to prepare the polyurethane covering film is not limited to 4,4'-diphenylmethane diisocyanate as used in this example and other diisocyanates such as that used in Example 3 can also be used as will be appreciated by those skilled in the art. Additionaly, other aromatic diols such as 2,2'-bis(4-hydroxyphenyl)propane and the like can be used as the monomer b for the polyurethane covering film.

Figure 2:
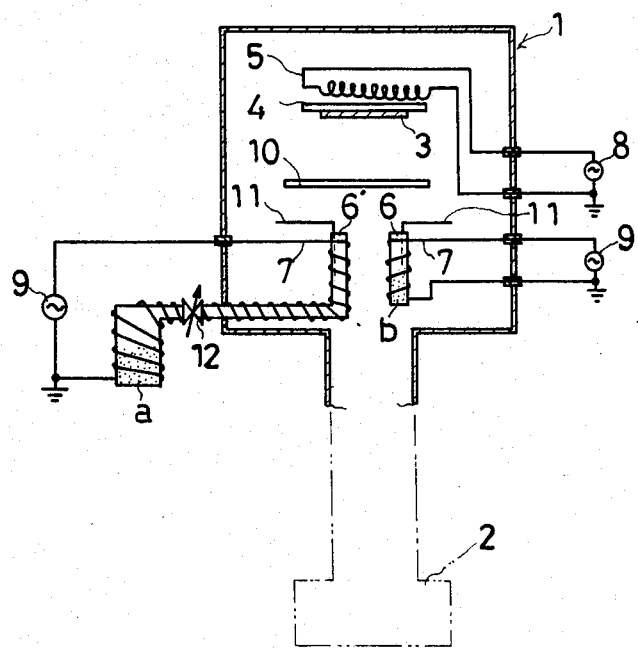
FIG. 2 is a sectional view of another embodiment of the apparatus of the invention.

FIG. 2 shows another embodiment of the apparatus for carrying out the present invention. In this embodiment, the apparatus is adapted for a process wherein a raw material monomer which is high in vapor pressure, such as the terephthalic acid dichloride in the foregoing example, is used. The evaporation container 6 for evaporating the raw material monomer a extends to the exterior of the treatment chamber 1 so that the raw material monomer a can be introduced, in the form of vapor thereof, into the treatment chamber 1 after being charged and evaporated in the externally extended portion of the container. In this way, adjustment of the vapor pressure can be easily carried out. Numeral 12 denotes a valve for adjusting the amount of vapor introduced into the chamber.

Figure 3:
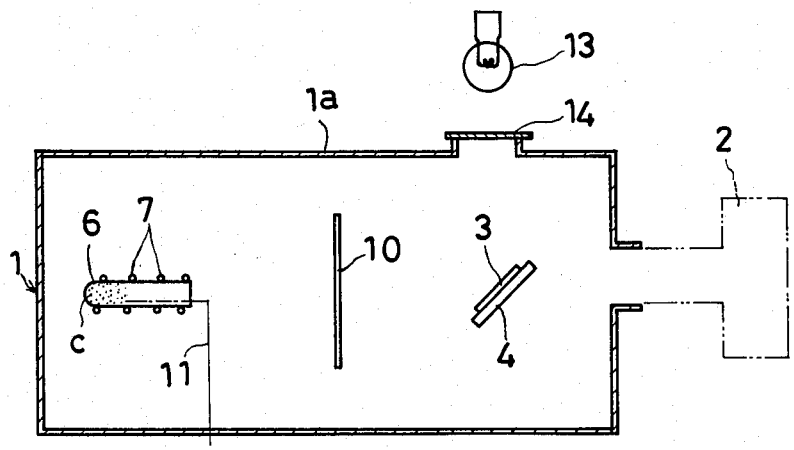
FIG. 3 is a sectional view of a third embodiment of the apparatus of the invention.

FIG. 3 shows another embodiment of an apparatus for carrying out the present invention by means of photopolymerization, wherein a single tubular container 6 is provided in the treatment chamber 1 and the substrate 3 facing the container 6 through the shutter 10 is held by the substrate holder 4 so as to be directed obliquely to the container 6. A light source 13 is provided outside the chamber, e.g., a xenon lamp, for irradiating the light on the substrate 3 through a quartz window 14 provided in a wall 1a of the treatment chamber 1. A raw material monomer c is charged to the container 6 and is arranged so as to be heated by the heater 7 coiled around the container 6 while the temperature is being measured through the thermocouple 11.

Thus, according to the process of the present invention, under a vacuum condition, at least two different raw material monomers for a predetermined synthetic resin is evaporated in order that vapors thereof may be polymerized on a substrate maintained at a temperature which causes said monomers to react with each other, thereby polymerizing to form the synthetic resin film. According to the process, pure and uniform monomer vapors not containing any impure matters and not subject to decomposition can be deposited on a substrate and brought into contact with each other. Thus, a controlled polymerization reaction is obtained and a synthetic resin film which is fine in structure, high in purity and uniform in thickness and which has good adhesion to the substrate can be formed. Additionally, any desired covering film thickness, including an extremely thin film, can be obtained. Also, it is possible to form any desired covering film of various molecular structures by selecting appropriate raw material monomers.

According to another aspect of this invention, a substrate holder and an evaporation container for a raw material monomer are so disposed as to face one another in a treatment chamber connected to a vacuum evacuation system, and a heater is provided behind the substrate holder and a heater is provided around the evaporation container. A shutter is interposed between the substrate holder and the evaporation container so that the evaporation amount of the raw material monomer and the polymerization temperature can be accurately controlled.

According to another aspect of this invention, at least one evaporation container is extended to the exterior of the chamber so that the monomer contained in the extended external part thereof may be heated, and the vapor pressure of the monomer evaporated can be easily controlled. In still another embodiment of the present invention, a light source is provided outside the treatment chamber for irradiating the substrate through a window of the treatment chamber so that a photopolymerization processed type covering film can be formed.

It will also be appreciated from the above detailed explanation of this invention that the use of an oligomer, instead of a monomer, can be used to achieve the purpose of this invention and is included in the spirit and scope of the invention.

What is claimed is:

1. A process for forming a synthetic resin film on a substrate and which comprises:
   (a) evaporating at least two different monomers to cause said monomers to adhere to a surface of said substrate, and
   (b) polymerizing said at least two different monomers on said surface of said substrate by maintaining said substrate at a temperature which causes said monomers to react with each other, thereby heat polymerizing to form said synthetic resin film;
   wherein said process is carried out under vacuum.

2. The process of claim 1, wherein the pressure of said vacuum is about $1 \times 10^{-2}$ to $1 \times 10^{-6}$ Torr.

3. The process of claim 1 or 2, wherein said at least two different monomers polymerize by condensation polymerization.

4. The process of claim 1 or 2, wherein said at least two different monomers polymerize by addition polymerization.

5. The process of claim 3 wherein said synthetic resin is a polyimide.

6. The process of claim 5, wherein said at least two different monomers comprise an aromatic acid dianhydride and an aromatic diamine.

7. The process of claim 5, wherein said at least two different monomers comprise pyromellitic acid dianhydride and 4,4'-diaminodiphenylether.

8. The process of claim 3, wherein said synthetic resin is a polyamide.

9. The process of claim 8, wherein said at least two different monomers comprise an aromatic acid dichloride and an aromatic diamine.

10. The process of claim 8, wherein said at least two different monomers comprise terephthalic acid dichloride and 4,4'-diaminodiphenylether.

11. The process of claim 4, wherein said synthetic resin is a polyurea.

12. The process of claim 11, wherein said at least two different monomers comprise a diisocyanate and an aromatic diamine.

13. The process of claim 11, wherein said at least two different monomers comprise 4,4'-diphenylmethane diisocyanate and 4,4'-diaminodiphenylether.

14. The process of claim 4, wherein said synthetic resin is a polyurethane.

15. The process of claim 14, wherein said at least two different monomers comprise a diisocyanate and an aromatic diol.

16. The process of claim 14, wherein said at least two different monomers comprise 4,4'-diphenylmethane diisocyanate and p-hydroquinone.

17. An apparatus for forming a synthetic resin covering film on a substrate comprising a treatment chamber; a vacuum evacuation system connected to said chamber; a substrate holder within said chamber and at least two evaporation containers for evaporating at least two different raw material monomers provided within said chamber and disposed so as to face said substrate holder a heater provided behind said substrate holder for heating said substrate; a heater provided around each of said evaporation containers for heating said monomers; and a shutter capable of being opened and closed and interposed between and separating said substrate holder and said evaporation containers.

18. The apparatus of claim 17, wherein at least one evaporation container extends to the exterior of the treatment chamber, and the extended portion thereof is provided with a heater for heating one of said monomers.

* * * * *